US006969641B2

(12) United States Patent
Matsunami

(10) Patent No.: US 6,969,641 B2
(45) Date of Patent: Nov. 29, 2005

(54) METHOD AND SYSTEM FOR INTEGRATED CIRCUIT PACKAGING

(75) Inventor: Akira Matsunami, Beppu (JP)

(73) Assignee: Texas Instruments Incorporated, Dallas, TX (US)

( * ) Notice: Subject to any disclaimer, the term of this patent is extended or adjusted under 35 U.S.C. 154(b) by 114 days.

(21) Appl. No.: 10/648,987

(22) Filed: Aug. 27, 2003

(65) Prior Publication Data

US 2005/0048699 A1 Mar. 3, 2005

(51) Int. Cl.[7] .............................................. H01L 21/44

(52) U.S. Cl. ..................... 438/127; 438/112; 438/124; 438/126

(58) Field of Search ........................ 438/127, 112, 124, 438/126; 269/288, 903; 118/45, 503; 204/196.16, 204/298.15

(56) References Cited

U.S. PATENT DOCUMENTS 6,224,936 B1 * 5/2001 Gochnour et al. ......... 427/96.2
6,432,750 B2 * 8/2002 Jeon et al. .................. 438/122
2001/0045643 A1 * 11/2001 Katoh et al. ................ 257/706

* cited by examiner

*Primary Examiner*—Amir Zarabian
*Assistant Examiner*—Christy Novacek
(74) *Attorney, Agent, or Firm*—Yingsheng Tung; Wade James Brady, III; Frederick J. Telecky, Jr.

(57) ABSTRACT

According to one embodiment of the invention, a method of packaging integrated circuits includes disposing an integrated circuit chip outwardly from a first surface of a substrate, positioning the integrated circuit chip and the substrate between a first mold press die and a second mold press die, and engaging the first mold press die with the second mold press die such that the integrated circuit chip is disposed within a cavity formed by the engagement of the first mold press die with the second mold press die. The cavity includes a pre-warped configuration. The method further includes encapsulating the integrated circuit chip with a mold compound such that the mold compound takes on the pre-warped configuration of the cavity, removing the encapsulated integrated circuit chip from the cavity, and curing the mold compound. The curing transforms the mold compound from the pre-warped configuration to a predefined configuration.

20 Claims, 2 Drawing Sheets

METHOD AND SYSTEM FOR INTEGRATED CIRCUIT PACKAGING

TECHNICAL FIELD OF THE INVENTION

This invention relates generally to the field of integrated circuit packaging and, more specifically, to an improved method and system for integrated circuit packaging.

BACKGROUND OF THE INVENTION

Packaging of integrated circuits, like quad flat packages ("QFPs") and ball grid arrays ("BGAs"), include encapsulating semiconductor chips and their associated components within a molding. A mold press compresses a mold compound between mold press die to allow the mold compound to cure. After curing, the mold press die are removed to obtain the completed, or partially completed, packages. However, current molding techniques, combined with the fact that integrated circuit packaging is resulting in thinner packages, often lead to warpage of the mold compound after removal of the mold press die due to residual stresses that build up during the cure process. This warpage leads to many problems, such as poor quality, poor reliability, and difficult testing of the integrated circuit packages.

SUMMARY OF THE INVENTION

According to one embodiment of the invention, a method of packaging integrated circuits includes disposing an integrated circuit chip outwardly from a first surface of a substrate, positioning the integrated circuit chip and the substrate between a first mold press die and a second mold press die, and engaging the first mold press die with the second mold press die such that the integrated circuit chip is disposed within a cavity formed by the engagement of the first mold press die with the second mold press die. The cavity includes a pre-warped configuration. The method further includes encapsulating the integrated circuit chip with a mold compound such that the mold compound takes on the pre-warped configuration of the cavity, removing the encapsulated integrated circuit chip from the cavity, and curing the mold compound. The curing transforms the mold compound from the pre-warped configuration to a predefined configuration.

Some embodiments of the invention provide numerous technical advantages. Other embodiments may realize some, none, or all of these advantages. For example, package warpage is considered in advance, when designing the mold press. Mold press die are formed with "pre-warped" cavities. This compensates for any warpage that may take place during the molding process, thereby leading to proper dimensions and tolerances for the completed integrated circuit packages.

Other technical advantages are readily apparent to one skilled in the art from the following figures, descriptions, and claims.

BRIEF DESCRIPTION OF THE DRAWINGS

For a more complete understanding of the invention, and for further features and advantages, reference is now made to the following description, taken in conjunction with the accompanying drawings, in which.

DETAILED DESCRIPTION OF EXAMPLE EMBODIMENTS OF THE INVENTION

Example embodiments of the present invention and their advantages are best understood by referring now to FIG. 1 through 3D of the drawings, in which like numerals refer to like parts.

Figure 1:
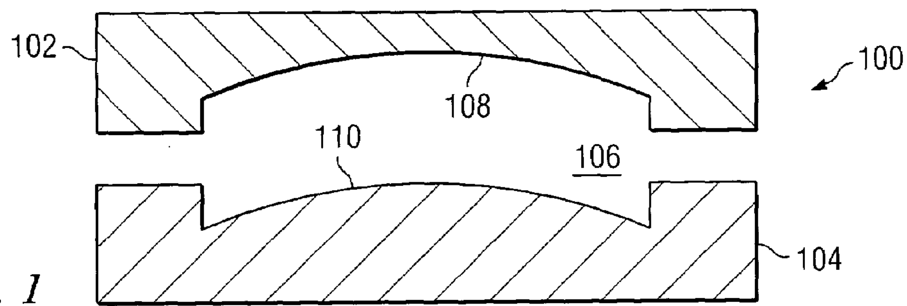
FIG. 1 is a cross-sectional view of a mold press having an upper mold press die and a lower mold press die according to an embodiment of the invention.

FIG. 1 is a cross-sectional view of a mold press 100 having an upper mold press die 102 and a lower mold press die 104 according to an embodiment of the present invention. As described in more detail below in conjunction with FIGS. 2A through 2D and FIGS. 3A through 3D, mold press 100 functions to package integrated circuits by injecting a mold compound into a cavity 106 formed by the engagement of first mold press die 102 and second mold press die 104.

According to the teachings of one embodiment of the invention, first mold press die 102 has a first non-planar surface 108 and second mold press die 104 has a second non-planar surface 110, resulting in cavity 106 having a pre-warped configuration. This pre-warped configuration of cavity 106 takes into account the warpage that occurs to the mold compound during the curing process after encapsulation of the integrated circuit die. In other words, the curing process, which often includes the mold compound to a suitable heat source, relieves residual stresses that develop in the mold compound during the encapsulation process. This stress relieving oftentimes changes the shape and/or configuration of the mold compound in such a manner that it becomes distorted or warped from its original shape. Therefore, the warpage of the mold compound, according to the teachings of the present invention, is considered in advance when designing mold press 100. Otherwise, if cavity 106 of mold press 100 has a rectangular cross-section, like current mold presses, then the integrated circuit packages will be slightly warped from the desired rectangular cross section, which may cause many problems, such as quality, reliability, and testability problems.

In the example embodiment illustrated in FIG. 1, first non-planar surface 108 includes a concave surface and second non-planar surface 110 includes a convex surface. This results in cavity 106 having a slightly curved rectangular cross section. When the integrated circuit package is removed from cavity 106 of mold press 100 after the injection of a mold compound to encapsulate an integrated circuit chip, the package will be slightly curved, resembling the configuration of cavity 106. However, during the curing process, the residual stresses developed are relieved and the package slightly distorts into a final desired configuration, which is typically a rectangular parallelpiped. One example of this is illustrated below in conjunction with FIGS. 2A through 2D in which a ball grid array ("BGA") package 220 is formed using mold press die 100 and another example of this is illustrated below in conjunction with FIGS. 3A through 3D in which a quad flat package ("QFP") is illustrated using mold press die 100.

First mold press die 102 and second mold press die 104 may be formed from any suitable material, and first non-planar surface 108 and second non-planar surface 110 may have any suitable profile. Accordingly, cavity 106 may have any suitable pre-warped configuration. Again, this pre-warped configuration takes into account the warpage that the mold compound will experience during the curing process so that the final desired configuration for a particular integrated circuit package is obtained. Any particular warpage depends upon many factors, some of which are the size of the package desired, as well as the type of material of the mold compound. It may also depend upon the temperature that the mold compound sees during the curing process. In a particular embodiment, a warpage of approximately 0.1 mm occurs for every 1.0 mm thickness of an integrated circuit package. The determination of the pre-warped configuration may be based on experience or may be based on any suitable mathematical calculations or suitable computer program.

Figure 2A:
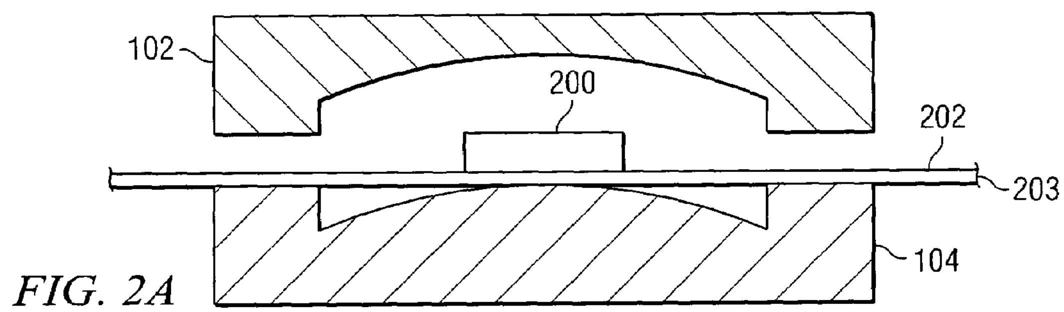
FIGS. 2A through 2D are a series of cross-sectional elevation views illustrating an example method of packaging ball grid arrays in accordance with an embodiment of the invention.

FIGS. 2A through 2D are a series of cross-sectional elevation views illustrating an example method of packaging a ball grid array according to one embodiment of the invention. Even though only one ball grid array is illustrated as being packaged, any suitable number of ball grid arrays may be packaged according to the illustrated example embodiment. As illustrated in FIG. 2A, an integrated circuit chip 200 is disposed outwardly from a first surface 202 of a substrate 203. Integrated circuit chip 200 may be any suitable integrated circuit chip formed from any suitable material and having any suitable circuitry formed therein. Substrate 203 may also be any suitable material, such as a polyimide or suitable organic material, and may also have any suitable circuitry formed therein. Integrated circuit chip 200 and substrate 203 are positioned between first mold press die 102 and second mold press die 104. Accordingly, integrated circuit chip 200 is generally centered within cavity 106.

Figure 2B:
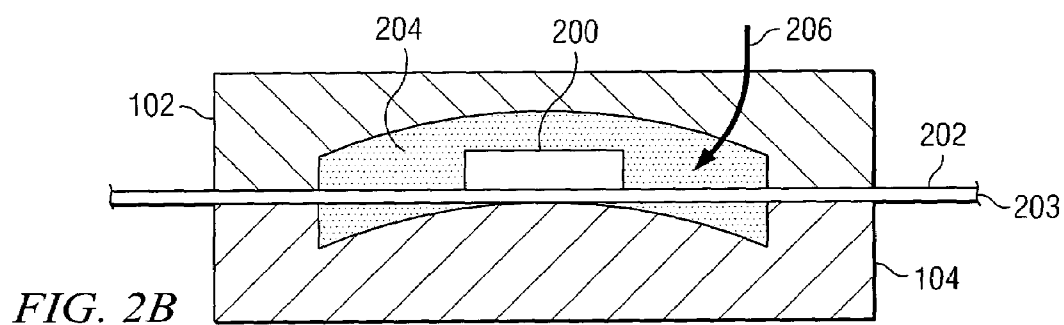

Referring to FIG. 2B, first mold press die 102 and second mold press die 104 are then engaged and clamped together so that cavity 106 is ready to be filled with a suitable mold compound 204. As illustrated by arrow 206, cavity 106 is filled with mold compound 204 such that integrated circuit chip 200 is encapsulated by mold compound 204. Any suitable method for introducing mold compound 204 into cavity 106 may be utilized; however, in one embodiment a runner (not shown) is utilized. Mold compound 204 may be any suitable material, such as a suitable polymer.

Figure 2C:
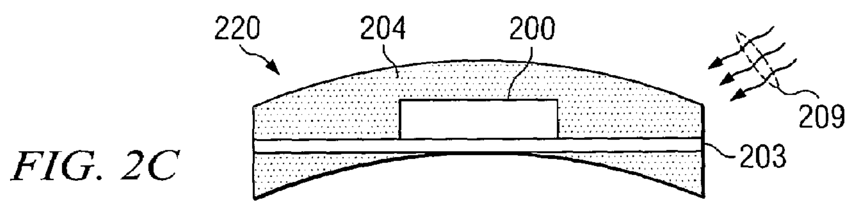

Referring to FIG. 2C, integrated circuit chip 200, now encapsulated by mold compound 204, has been removed from between first mold press die 102 and second mold press die 104. As illustrated, mold compound 204 has a slightly warped configuration which resembles the configuration of cavity 106. The amount of warpage is exaggerated for clarity purposes. A heat source 209 is used to cure mold compound 204. This curing by heat source 209 relieves the residual stresses developed during the encapsulation process, thereby straightening out mold compound 204, which is illustrated in FIG. 2D.

Figure 2D:
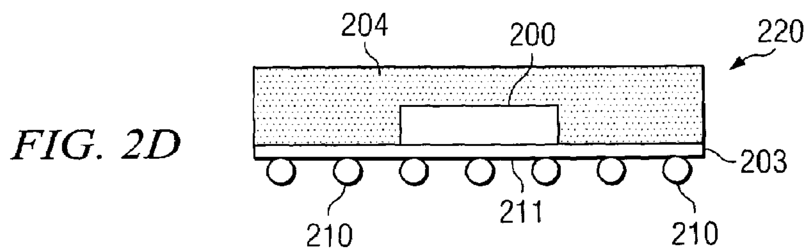

FIG. 2D shows the final configuration for ball grid array package 220. As illustrated, mold compound 204 is now in its final desired configuration, which, in this embodiment, is a rectangular parallelpiped. Also illustrated in FIG. 2D are a plurality of solder balls 210 which are coupled to a second surface 211 of substrate 203. BGA package 220 may now be tested without having to worry about any problems due to a warped package, as in prior packages that have been manufactured with prior mold presses that have cavities that do not take into account warpage during the curing process.

Figure 3A:
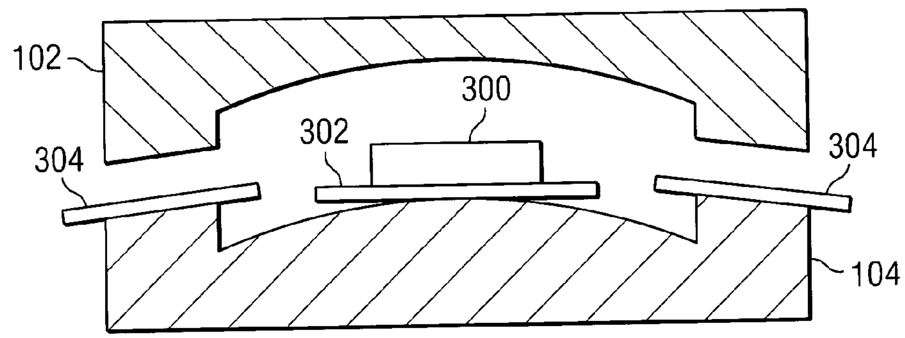
FIGS. 3A through 3D are a series of cross-sectional elevation views illustrating an example method of packaging quad flat packages in accordance with an embodiment of the invention.

FIGS. 3A through 3D are a series of cross-sectional elevation views illustrating an example method of forming a quad flat package 320 in accordance with an embodiment of the invention. Even though only one quad flat package is illustrated as being formed, any suitable number of quad flat packages may be formed according to the illustrated example embodiment. As illustrated in FIG. 3A, an integrated circuit chip 300 is disposed outwardly from a substrate 302. Integrated circuit chip 300 and substrate 302 are positioned between first mold press die 102 and second mold press die 104. In addition, a leadframe 304 is also positioned between first mold press die 102 and second mold press die 104 such that it surrounds integrated circuit chip 300. Integrated circuit chip 300 may be any suitable integrated circuit chip formed from any suitable material and having any suitable circuitry formed therein. In addition, substrate 302 may be formed from any suitable material, such as a polyimide or organic material. Leadframe 304 may be formed from any suitable metal.

Figure 3B:
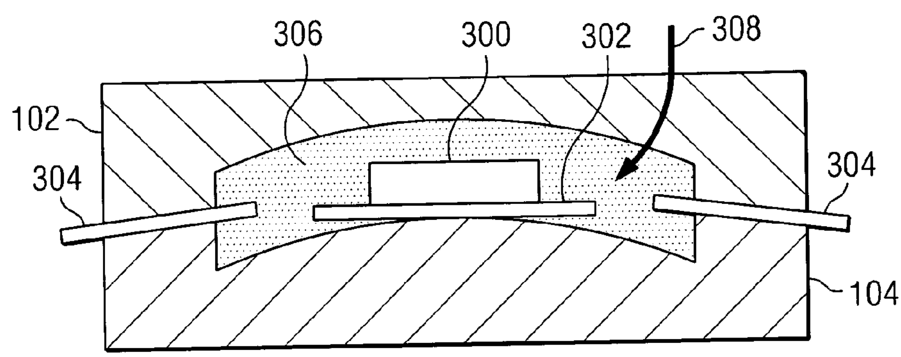

Referring to FIG. 3B, first mold press die 102 and second mold press die 104 are then engaged and clamped together so that cavity 106 is ready to be filled with a suitable mold compound 306. As illustrated by arrow 308, cavity 106 is filled with mold compound 306 such that integrated circuit chip 300 is encapsulated by mold compound 306. Any suitable method for introducing mold compound 306 into cavity 106 may be utilized; however, in one embodiment a runner (not shown) is utilized. Mold compound 306 may be any suitable material, such as a suitable polymer.

Figure 3C:
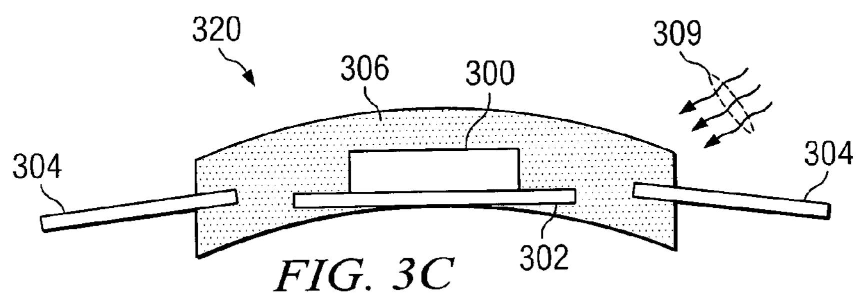

FIG. 3C illustrates quad flat package 320 right after it has been removed from between first mold press die 102 and second mold press die 104. As illustrated in FIG. 3C, mold compound 306 is in a slightly warped configuration, which resembles the configuration of cavity 106. The amount of warpage is exaggerated for clarity purposes. A heat source 309 is utilized to cure mold compound 306. This curing process relieves the residual stresses developed in mold compound 306 during the encapsulation process. Quad flat package 320 then takes on its final desired configuration as shown in FIG. 3D.

Figure 3D:
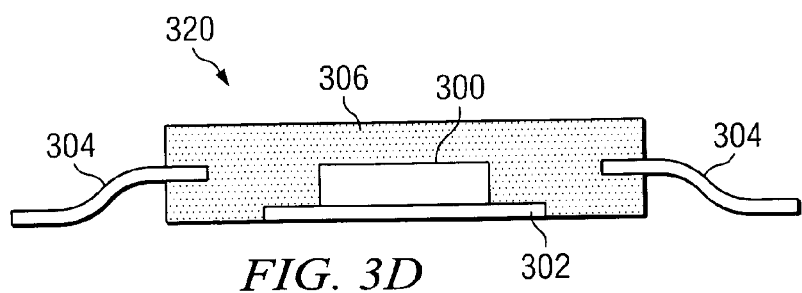

FIG. 3D shows the final configuration for quad flat package 320. As illustrated, mold compound 306 is now in its final desired configuration, which, in this embodiment, is a rectangular parallelpiped. Also illustrated in FIG. 3D is leadframe 304 being formed to finalize quad flat package 320. Quad flat package 320 may now be tested without having to worry about any problems due to a warped package, as in prior packages that have been manufactured with prior mold presses that have cavities that do not take into account warpage during the curing process.

Although ball grid arrays and quad flat packages are illustrated above as being formed using mold press 100, any suitable integrated circuit packages may be formed utilizing mold press die 100, which has a pre-warped configuration to take into account the warpage that occurs during the curing process of the mold compound utilized.

Although embodiments of the invention and their advantages are described in detail, a person skilled in the art could make various alterations, additions, and omissions without departing from the spirit and scope of the present invention, as defined by the appended claims.

What is claimed is:

1. A method of packaging an integrated circuit, comprising:

disposing an integrated circuit chip outwardly from a first surface of a substrate;

positioning the integrated circuit chip and the substrate between a first mold press die and a second mold press die;

engaging the first mold press die with the second mold press die such that the integrated circuit chip is disposed within a cavity formed by the engagement of the first mold press die with the second mold press die, the cavity comprising a pre-warped configuration based on an anticipated warpage of a mold compound when removed from the cavity and further based on a predefined configuration of the mold compound after curing; and encapsulating the integrated circuit chip with the mold compound such that the mold compound takes on the pre-warped configuration of the cavity;

removing the encapsulated integrated circuit chip from the cavity; and curing the mold compound, whereby the curing transforms the mold compound from the pre-warped configuration to a predefined configuration.

2. The method of claim 1, further comprising coupling a plurality of solder balls to a second surface of the substrate opposite the first surface.

3. The method of claim 1, further comprising disposing a leadframe around a periphery of the integrated circuit chip before the encapsulating step.

4. The method of claim 1, wherein the pre-warped configuration of the cavity is defined by a first non-planar surface on the first mold press die and a second non-planar surface on the second mold press die.

5. The method of claim 1, wherein the pre-warped configuration of the cavity is defined by a concave surface on the first mold press die and a convex surface on the second mold press die.

6. The method of claim 1, wherein the predefined configuration substantially resembles a rectangular parallelpiped.

7. The method of claim 1, wherein the integrated circuit package comprises a ball grid array.

8. The method of claim 1, wherein the integrated circuit package comprises a quad flat package.

9. A system for packaging an integrated circuit, comprising:

an integrated circuit chip disposed outwardly from a first surface of a substrate;

a first mold press die comprising a first non-planar surface;

a second mold press die comprising a second non-planar surface;

the first and second non-planar surfaces forming upper and lower surfaces of a cavity when the first and second mold press die are engaged; and the cavity having a pre-warped configuration based on an anticipated warpage of a mold compound when removed from the cavity and further based on a predefined configuration of the mold compound after curing.

10. The system of claim 9, further comprising a plurality of solder balls coupled to a second surface of the substrate opposite the first surface.

11. The system of claim 9, further comprising a leadframe disposed around a periphery of the integrated circuit chip.

12. The system of claim 9, wherein the first non-planar surface comprises a concave surface and the second non-planar surface comprises a convex surface.

13. The system of claim 9, wherein the predefined configuration substantially resembles a rectangular parallelpiped.

14. The system of claim 9, wherein the integrated circuit package comprises a ball grid array.

15. The system of claim 9, wherein the integrated circuit package comprises a quad flat package.

16. A method of packaging an integrated circuit, comprising:

providing a substrate;

providing an integrated circuit chip adapted to couple to the substrate;

providing a first mold press die comprising a first non-planar surface;

providing a second mold press die comprising a second non-planar surface, the first and second non-planar surfaces forming upper and lower surfaces of a cavity when the first and second mold press die are engaged;

providing a mold compound adapted to fill the cavity and encapsulate the integrated circuit chip;

determining a pre-warped configuration for the cavity based on an anticipated warpage of the mold compound when removed from the cavity and further based on a predefined configuration of the mold compound after curing; and causing the cavity to resemble the pre-warped configuration by shaping the first and second non-planar surfaces, whereby the mold compound is adapted to transform from the pre-warped configuration to a predefined configuration during the curing of the mold compound.

17. The method of claim 16, wherein the first non-planar surface comprises a concave surface and the second non-planar surface comprises a convex surface.

18. The method of claim 16, wherein the predefined configuration substantially resembles a rectangular parallelpiped.

19. The method of claim 16, wherein the integrated circuit package comprises a ball grid array.

20. The method of claim 16, wherein the integrated circuit package comprises a quad flat package.

* * * * *